(12) United States Patent
Song

(10) Patent No.: US 10,204,942 B1
(45) Date of Patent: Feb. 12, 2019

(54) METHOD FOR MANUFACTURING TOP-GATED THIN FILM TRANSISTORS

(71) Applicant: Shenzhen China Star Optoelectronics Semiconductor Display Technology Co., Ltd., Shenzhen, Guangdong (CN)

(72) Inventor: Liwang Song, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/742,153

(22) PCT Filed: Sep. 11, 2017

(86) PCT No.: PCT/CN2017/101162
§ 371 (c)(1),
(2) Date: Jan. 5, 2018

(30) Foreign Application Priority Data

Jul. 19, 2017 (CN) .......................... 2017 1 0592932

(51) Int. Cl.
H01L 27/12 (2006.01)
H01L 21/027 (2006.01)
H01L 29/786 (2006.01)
H01L 29/66 (2006.01)
H01L 29/49 (2006.01)

(52) U.S. Cl.
CPC ...... *H01L 27/1288* (2013.01); *H01L 21/0274* (2013.01); *H01L 27/127* (2013.01); *H01L 27/1222* (2013.01); *H01L 27/1225* (2013.01); *H01L 29/4908* (2013.01); *H01L 29/66757* (2013.01); *H01L 29/66969* (2013.01); *H01L 29/7869* (2013.01); *H01L 29/78666* (2013.01)

(58) Field of Classification Search
CPC ............... H01L 27/127; H01L 27/1288; H01L 27/1222; H01L 29/4908; H01L 29/66757; H01L 29/78666; H01L 21/0274
See application file for complete search history.

(56) References Cited

U.S. PATENT DOCUMENTS

| 6,037,611 A | * | 3/2000 | Jang | H01L 29/66757 257/412 |
| 7,361,535 B2 | * | 4/2008 | Nam | H01L 27/1214 438/157 |
| 8,987,743 B2 | * | 3/2015 | Zhang | H01L 27/1288 257/347 |
| 9,502,437 B2 | * | 11/2016 | Qin | H01L 27/1288 |
| 2018/0114854 A1 | * | 4/2018 | Xie | H01L 21/44 |

* cited by examiner

*Primary Examiner* — Thanh Y Tran
(74) *Attorney, Agent, or Firm* — Ladas & Parry LLP

(57) ABSTRACT

A method for manufacturing the top-gated thin film transistors is disclosed and includes forming a first photoresist pattern with a first shielding portion and two second shielding portions, and etching a gate metal layer by adopting the first photoresist pattern as a mask. Thus, a size of the gate pattern coincides with a size of a channel region of a conductive channel, to increase a control force of a gate to the conductive channel, thereby improving performance of device.

17 Claims, 6 Drawing Sheets

METHOD FOR MANUFACTURING TOP-GATED THIN FILM TRANSISTORS

FIELD OF THE INVENTION

The present disclosure relates to a technical field of displays, and particularly to a method for manufacturing top-gated thin film transistors.

BACKGROUND OF THE INVENTION

Thin film transistors can be divided into bottom-gated thin film transistors and top-gated thin film transistors according to structure of the thin film transistors. In this way, parasitic capacitance, formed between a source/drain and a gate of the top-gated thin film transistor, may be significantly reduced, thereby increasing open-state current of the thin film transistor and enhancing operational speed of a device with the transistor, which facilitates reduced size of the device. Thus, it has become a hot industrial research area in recent years.

In conventional methods for manufacturing top-gated thin film transistors, steps of forming a gate pattern specifically include forming a gate metal layer, and performing an etching process on the gate metal layer. However, in the process of etching the gate metal layer, the metal can easily be over-etched, such that a width of the gate pattern is smaller than a width of a channel region of a conductive channel, and the gate cannot completely control the conductive channel. Thus, current between the source and the drain is reduced, and performance of the device with thin film transistors is reduced.

Therefore, it is necessary to provide a method for manufacturing top-gated thin film transistors to solve the problems which exist in the prior art.

SUMMARY OF THE INVENTION

An object of the present disclosure is to provide a method for manufacturing top-gated thin film transistors, to enhance a control force for a conductive channel and a performance of device.

The present disclosure provides a method for manufacturing top-gated thin film transistors. The method includes processes of forming a conductive channel, a gate insulation layer, and a gate pattern on a substrate; wherein the processes of forming the conductive channel, the gate insulation layer, and the gate pattern on the substrate specifically include:
forming an active layer on the substrate, the active layer comprising a source region, a drain region, and a channel region;
forming a gate insulation layer, a gate metal layer, and a photoresist layer on the active layer in sequence;
performing a patterning process for the photoresist layer to form a first photoresist pattern, wherein the first photoresist pattern comprises a first shielding portion and two second shielding portions positioned at two sides of the first shielding portion; a projection of the first shielding portion on the substrate coincides with a projection of the channel region on the substrate; and a thickness of the first shielding portion is larger than a thickness of the second shielding portion;
etching the gate metal layer by adopting the first photoresist pattern as a mask for forming a gate pattern;
performing an ashing process for the second shielding portion of the first photoresist pattern to remove the second shielding portion of the first photoresist pattern to form a second photoresist pattern;
etching the gate insulation layer by adopting the second photoresist pattern as another mask for exposing the source region and the drain region; and
performing a conductorizing process for the active layer to form a source contact region on the source region and to form a drain contact region on the drain region, wherein the source contact region, the drain contact region, and the channel region commonly form a conducting channel;
wherein a projection of the gate pattern on the substrate coincides with a projection of the channel region on the substrate, and the ashing process is performed for the second shielding portion of the first photoresist pattern by adopting oxygen.

In the method for manufacturing the top-gated thin film transistors, the patterning process for the photoresist layer to form the first photoresist pattern includes:
exposing the photoresist layer by adopting a halftone mask, and developing the exposed photoresist layer by a developing solution to form the first photoresist pattern.

In the method for manufacturing the top-gated thin film transistors, a material of the active layer is indium gallium zinc oxide or amorphous silicon.

In the method for manufacturing the top-gated thin film transistors, the manufacturing method further includes: a process of forming an inter-layers insulation layer, a source, and a drain, wherein the process of forming the inter-layers insulation layer, the source, and the drain specifically comprises steps of:
stripping the second photoresist pattern;
forming the inter-layers insulation layer on the gate pattern, the source contact region, and the drain contact region; and
forming a first through hole and a second through hole passing through the inter-layers insulation layer, wherein the first through hole and the second through hole expose the source contact region and the drain contact region, respectively; and
forming the source and the drain on the inter-layers insulation layer, wherein the source and the drain are contacted with the source contact region and the drain contact region through the first through hole and the second through hole, respectively.

In the method for manufacturing the top-gated thin film transistors, the step of stripping the second photoresist pattern specifically includes: soaking the second photoresist pattern in a peeling liquid.

In the method for manufacturing the top-gated thin film transistors, wherein a material of the gate insulation layer comprises one or both of silicon oxide and silicon nitride.

In the method for manufacturing the top-gated thin film transistors, wherein the conductorizing process for the active layer is performed by adopting plasma.

The present disclosure further provides a method for manufacturing top-gated thin film transistors, the method includes:
a process of forming a conductive channel, a gate insulation layer, and a gate pattern on a substrate; wherein the process of forming the conductive channel, the gate insulation layer, and the gate pattern on the substrate specifically includes:
forming an active layer on the substrate, the active layer including a source region, a drain region, and a channel region;
forming a gate insulation layer, a gate metal layer, and a photoresist layer on the active layer in sequence;
performing a patterning process for the photoresist layer to form a first photoresist pattern, wherein the first photoresist pattern comprises a first shielding portion and two second shielding portions positioned at two sides of the first shielding portion; a projection of the first shielding portion on the substrate coincides with a projection of the channel region on the substrate; and a thickness of the first shielding portion is larger than a thickness of the second shielding portion;

etching the gate metal layer by adopting the first photoresist pattern as a mask for forming a gate pattern;

performing an ashing process for the second shielding portion of the first photoresist pattern to remove the second shielding portion of the first photoresist pattern to form a second photoresist pattern;

etching the gate insulation layer by adopting the second photoresist pattern as another mask for exposing the source region and the drain region; and performing a conductorizing process for the active layer to form a source contact region on the source region and to form a drain contact region on the drain region, wherein the source contact region, the drain contact region, and the channel region commonly form a conducting channel.

In the method for manufacturing the top-gated thin film transistors according to the present disclosure, a projection of the gate pattern on the substrate coincides with a projection of the channel region on the substrate.

In the method for manufacturing the top-gated thin film transistors according to the present disclosure, the patterning processing for the photoresist layer to form the first photoresist pattern includes:

exposing the photoresist layer by utilizing a halftone mask; and developing the exposed photoresist layer by a developing solution to form the first photoresist pattern.

In the method for manufacturing the top-gated thin film transistors according to the present disclosure, the patterning processing for the photoresist layer to form the first photoresist pattern comprises exposing the photoresist layer by utilizing a halftone mask; and developing the exposed photoresist layer by a developing solution to form the first photoresist pattern.

In the method for manufacturing the top-gated thin film transistors according to the present disclosure, an ash processing is performed for the second shielding portion of the first photoresist pattern by adopting oxygen.

In the method for manufacturing the top-gated thin film transistors according to the present disclosure, a material of the active layer is indium gallium zinc oxide or amorphous silicon.

The method for manufacturing the top-gated thin film transistors according to the present disclosure further comprises: a process of forming an inter-layers insulation layer, a source, and a drain, wherein the process of forming the inter-layers insulation layer, the source, and the drain specifically includes steps of:

stripping the second photoresist pattern;

forming the inter-layers insulation layer on the gate pattern, the source contact region, and the drain contact region, and forming a first through hole and a second through hole passing through the inter-layers insulation layer, wherein the first through hole and the second through hole expose the source contact region and the drain contact region, respectively; and forming the source and the drain on the inter-layers insulation layer, wherein the source and the drain are contacted with the source contact region and the drain contact region through the first through hole and the second through hole, respectively.

In the method for manufacturing the top-gated thin film transistors according to the present disclosure, the step of stripping the second photoresist pattern specifically includes: soaking the second photoresist pattern in a peeling liquid.

In the method for manufacturing the top-gated thin film transistors according to the present disclosure, a material of the gate insulation layer comprises one or both of silicon oxide and silicon nitride.

In the method for manufacturing the top-gated thin film transistors according to the present disclosure, the conductorizing process for the active layer is performed by adopting plasma.

The method for manufacturing the top-gated thin film transistors according to the present disclosure includes forming the first photoresist pattern having the first shielding portion and the second shielding portion, and adopting the first photoresist pattern as the mask for etching the gate metal layer. Thus, the size of the gate pattern coincides with the size of the channel region of the conductive channel, the control force of the gate to the conductive channel is enhanced, and the performance of the device is improved.

In order that the foregoing description of the present disclosure will become more clear, the preferred embodiments are given hereafter and are to be described in detail with reference to the accompanying drawings.

BRIEF DESCRIPTION OF THE DRAWINGS

The technical aspects and other advantageous effects of the present disclosure will be apparent from the following detailed description of specific embodiments of the disclosure taken in conjunction with the accompanying drawings.

DETAILED DESCRIPTION OF THE PREFERRED EMBODIMENTS

The technical means and effects thereof will be further elucidated with reference to the preferred embodiments of the present disclosure and their accompanying drawings. Obviously, the described embodiments are merely a part of embodiments of the present disclosure, and not all embodiments. All other embodiments obtained by those of ordinary skill in the art without making creative work are within the scope of the present disclosure, based on embodiments of the present disclosure.

A preferred embodiment of the present disclosure provides a method for manufacturing top-gated thin film transistors. The method includes forming a first photoresist pattern, etching a gate metal layer through adopting the first photoresist pattern as a mask, such that a projection of the gate pattern on a substrate and a projection of a gate insulation layer on the substrate both coincide with a projection of a channel region on the substrate. Thus, a control force of the gate to the conductive channel is enhanced.

Figure 1:
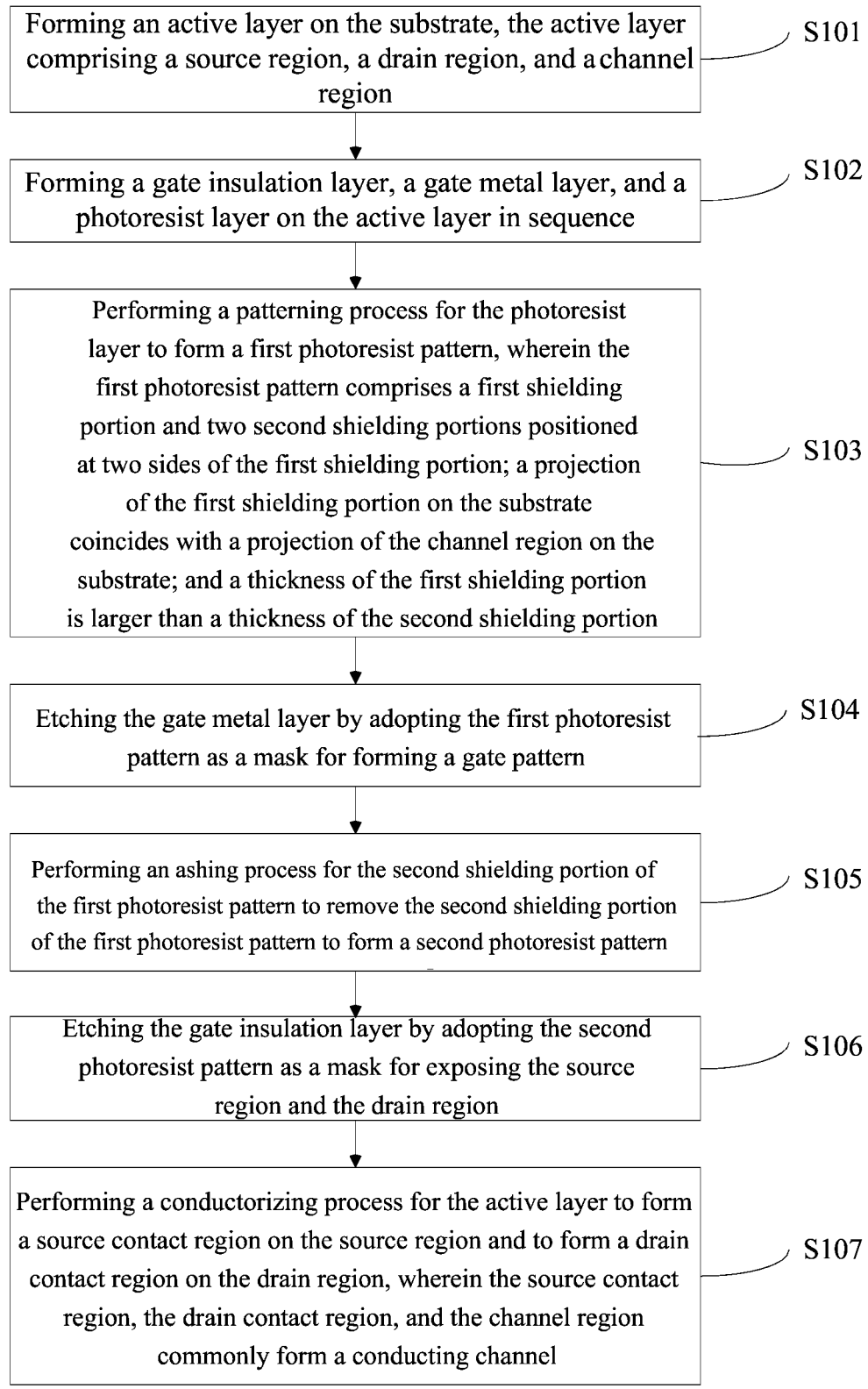
FIG. 1 illustrates a flowchart of a method for manufacturing top-gated thin film transistors provided in a preferred embodiment of the present disclosure.

Referring to FIG. 1, which illustrates a flowchart of a method for manufacturing the top-gated thin film transistors provided in a preferred embodiment of the present disclosure. As shown in FIG. 1, the preferred embodiment of the present disclosure provides the method for manufacturing the top-gated thin film transistors. The method is intended to increase the control force of the gate to the conductive channel, and is specifically achieved by the size of the gate pattern formed by precision control coinciding with the size of the channel region of the conductive channel.

The method for manufacturing the top-gated thin film transistors will be described in detail below with reference to specific embodiments. The method includes processes of forming a conductive channel, a gate insulation layer, and a gate pattern on a substrate. In addition, the processes of forming the conductive channel, the gate insulation layer, and the gate pattern on the substrate specifically include the following steps.

In step S101, forming an active layer on the substrate, the active layer including a source region, a drain region, and a channel region.

In step S102, forming a gate insulation layer, a gate metal layer, and a photoresist layer on the active layer in sequence.

In step S103, performing a patterning process for the photoresist layer to form a first photoresist pattern, wherein the first photoresist pattern includes a first shielding portion and two second shielding portions positioned at two sides of the first shielding portion; a projection of the first shielding portion on the substrate coincides with a projection of the channel region on the substrate; and a thickness of the first shielding portion is larger than a thickness of the second shielding portion.

In step S104, etching the gate metal layer by adopting the first photoresist pattern as a mask for forming a gate pattern.

In step S105, performing an ashing process for the second shielding portion of the first photoresist pattern to remove the second shielding portion of the first photoresist pattern to form a second photoresist pattern.

In step S106, etching the gate insulation layer by adopting the second photoresist pattern as a mask for exposing the source region and the drain region.

In step S107, performing a conductorizing process for the active layer to form a source contact region on the source region and to form a drain contact region on the drain region, wherein the source contact region, the drain contact region, and the channel region commonly form a conducting channel.

It should be noted that, in the method for manufacturing top-gated thin film transistors of the present disclosure, in order to suppress that the size of the gate does not coincide with the size of the channel region of the conductive channel due to the metal from being over-etched when the gate pattern is formed. The method is achieved by forming the first photoresist pattern, and adopting the first photoresist pattern as the mask for etching the gate metal layer to form a gate with a size coinciding with a size of the channel region of the conductive channel, thereby increasing the control force of the gate to the conductive channel and improving the performance of the device having the transistor.

Processes of the method for manufacturing the top-gated thin film transistors will be described in detail below with reference to FIGS. 2A to 2F, which illustrate schematic process diagrams of forming the conductive channel, the gate insulation layer, and the gate pattern on the substrate in the method for manufacturing the top-gated thin film transistors provided in the preferred embodiment of the present disclosure.

Figure 2A:
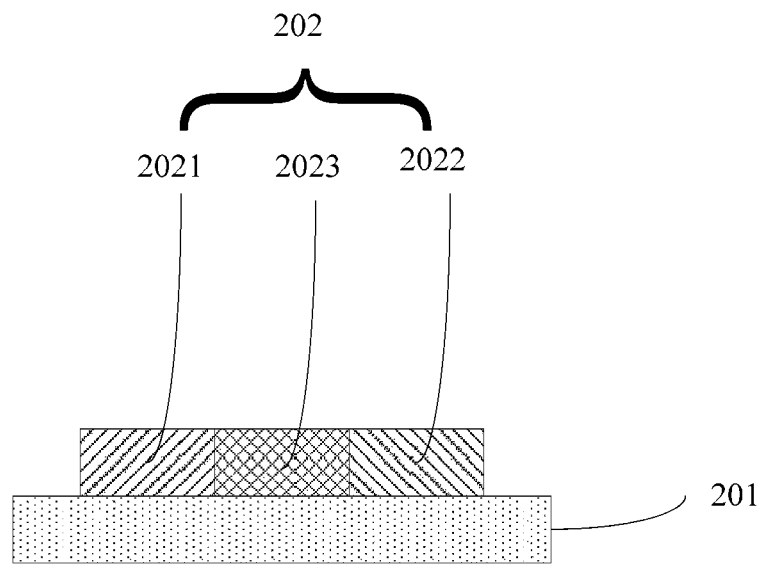
FIGS. 2A to 2F illustrate schematic process diagrams of forming a conductive channel, a gate insulation layer, and a gate pattern on a substrate in the method for manufacturing the top-gated thin film transistors provided in the preferred embodiment of the present disclosure.

In step S101, as shown in FIG. 2A, forming the active layer 202 on the substrate 201. The active layer 202 includes a source region 2021, a drain region 2022, and a channel region 2023, wherein a material of the active layer 202 is indium gallium zinc oxide or amorphous silicon. More specifically, in this preferred embodiment, the active layer 202 is deposed on the substrate 201, then the source region 2021, the drain region 2022, and the channel region 2023 of the top-gated thin film transistors of the preferred embodiment are defined by a graphical process. It should be noted that the graphical process at least includes steps such as photoresist coating or dripping, exposure, development, photolithography, etc. These steps belong to the usual means in the art and will not be described here.

Figure 2B:
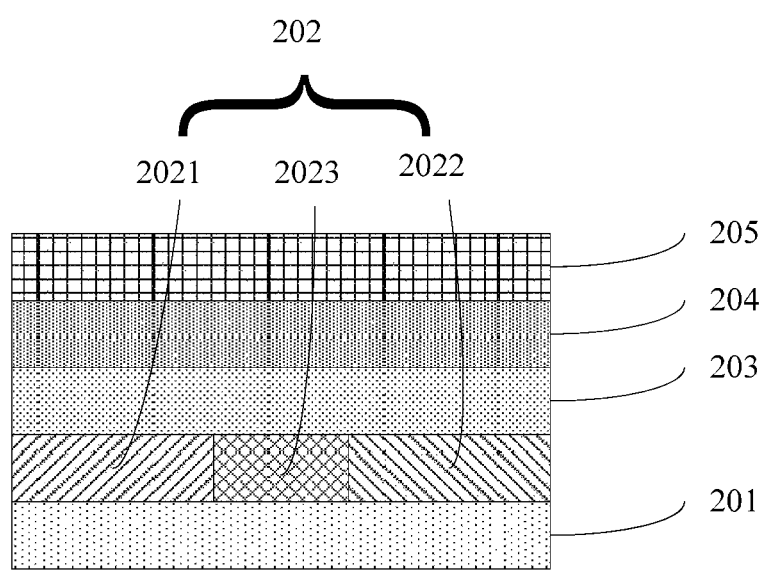

In step S102, as shown in FIG. 2B, forming a gate insulation layer 203, a gate metal layer 204, and a photoresist layer 205 on the active layer 202 in sequence. Preferably, a material of the gate insulation layer 203 may include one or both of silicon oxide and silicon nitride. It should be noted that the step S102 merely disposes the gate insulation layer 203, the gate metal layer 204, and the photoresist layer 205 on the active layer 202, while the gate insulating layer 203, the gate metal layer 204, and the photoresist layer 205 may be formed by a deposition method well known to those skilled in the art and will not be described here.

Figure 2C:
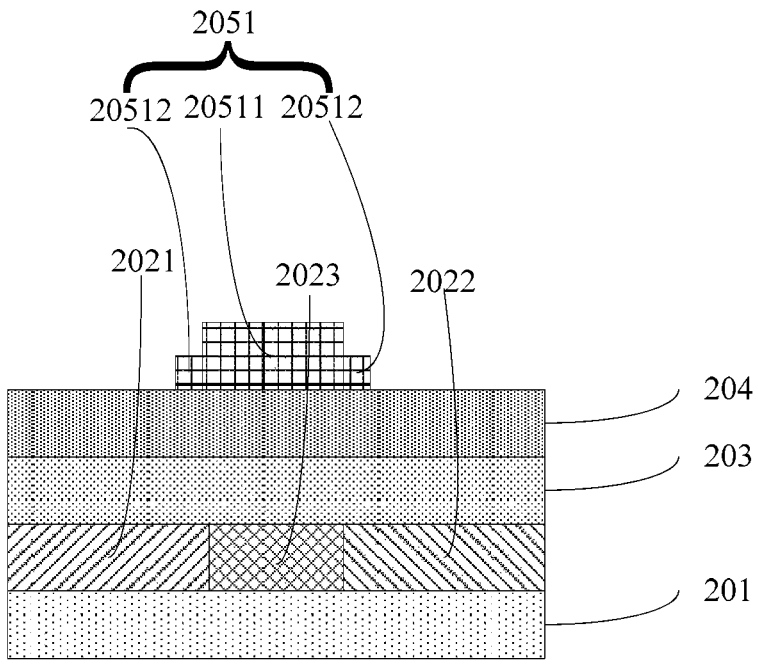

In step S103, as shown in conjunction with FIGS. 2B and 2C, performing a patterning process for the photoresist layer 205 to form a first photoresist pattern 2051, wherein the first photoresist pattern 2051 includes a first shielding portion 20511 and two second shielding portions 20512 positioned at two sides of the first shielding portion 20511. In addition, a projection of the first shielding portion 20511 on the substrate 201 coincides with a projection of the channel region 2023 on the substrate 201. Furthermore, a thickness of the first shielding portion 20511 is larger than a thickness of the second shielding portion 20512.

More specifically, in the step S103, the patterning process for the photoresist layer 205 to form the first photoresist pattern 2051 includes: exposing the photoresist layer 205 by adopting a halftone mask; and developing the exposed photoresist layer 205 by a developing solution to form the first photoresist pattern 2051.

Figure 2D:
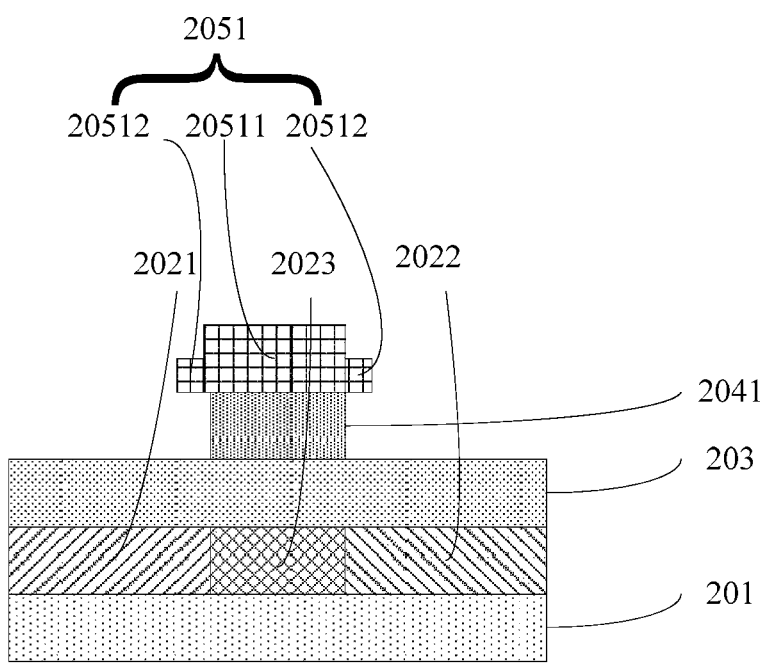

In step S104, as shown in conjunction with FIGS. 2C and 2D, etching the gate metal layer 204 by adopting the first photoresist pattern 2051 as a mask for forming a gate pattern 2041. It should be noted that the gate metal layer 204 may be etched by an etching method well known to those skilled in the art and will not be described here. The present disclosure emphasizes that the formed gate pattern 2041 coincides with the channel region 2023, i.e., the projection of the gate pattern 2041 on the substrate 201 coincides with the projection of the channel region 2023 on the substrate 201.

Figure 2E:
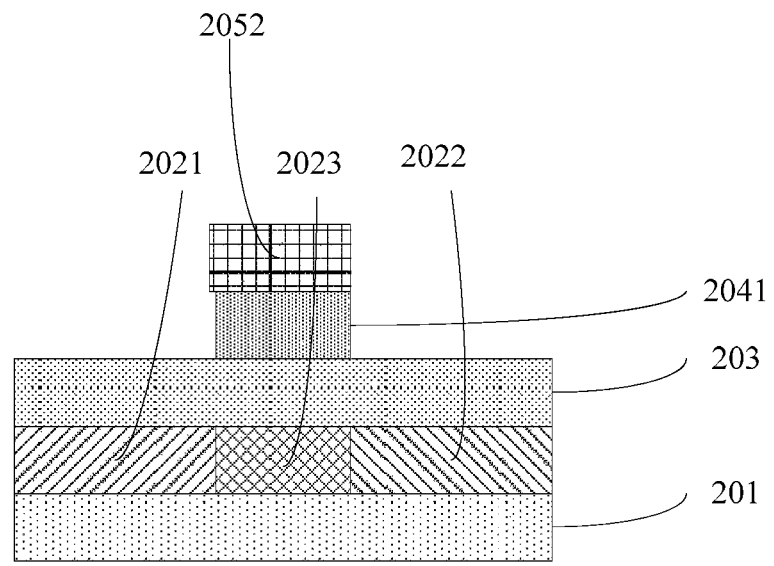

In step S105, as shown in FIG. 2E, performing an ashing process for the second shielding portion 20512 of the first photoresist pattern 2051 to remove the second shielding portion 20512 of the first photoresist pattern 2051 to form a second photoresist pattern 2052. Specifically, the second shielding portion 20512 of the first photoresist pattern 2051 is formed by the step S103, so that the formed gate pattern 2041 does not suffer from an effect of metal over-etching and the phenomenon that the size does not coincide with the channel region 2023. However, in step S105, in order to match the size of the gate insulating layer 203 to the size of the gate pattern 2041, the second shielding portion 20512 of the first photoresist pattern 2051 should be removed.

Preferably, the ashing process may be performed for the second shielding portion 20512 of the first photoresist pattern 2051 by adopting oxygen.

Figure 2F:
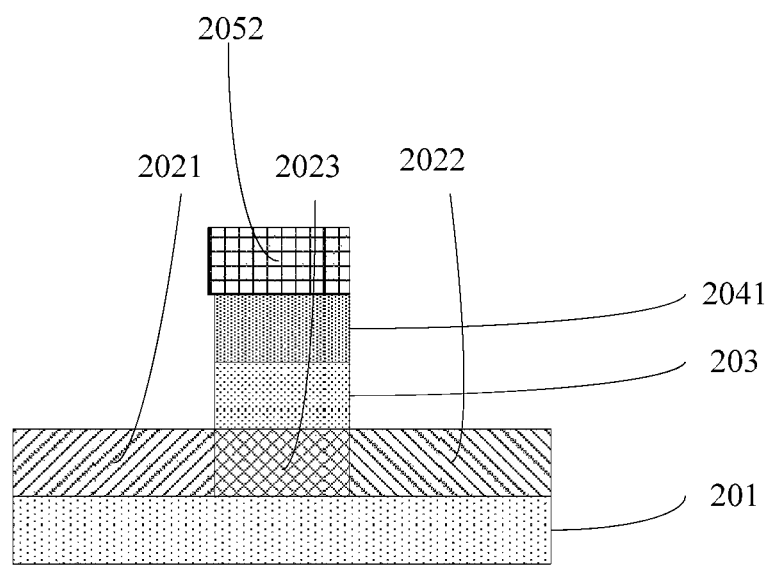

In step S106, as shown in conjunction with FIGS. 2E and 2F, etching the gate insulation layer 203 by adopting the second photoresist pattern 2052 as another mask for exposing the source region 2021 and the drain region 2022.

In step S107, as shown in FIG. 2F, performing a conductorizing process for the active layer to form a source contact region on the source region 2021 and to form a drain contact region on the drain region 2022, wherein the source contact region, the drain contact region, and the channel region 2023 commonly form a conducting channel. Preferably, the conductorizing process for the active layer may be performed by adopting plasma.

Figure 3A:
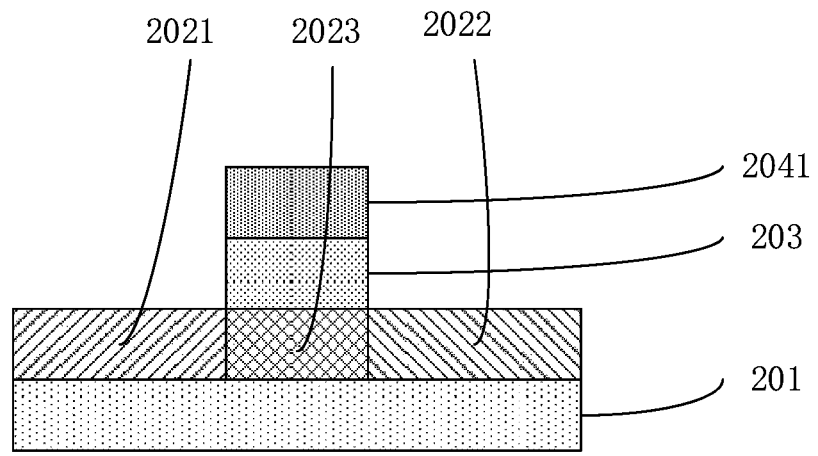
FIGS. 3A to 3C illustrate schematic process diagrams of forming an inter-layers insulation layer, a source, and a drain in the method for manufacturing the top-gated thin film transistors provided in the preferred embodiment of the present disclosure.
Figure 3B:
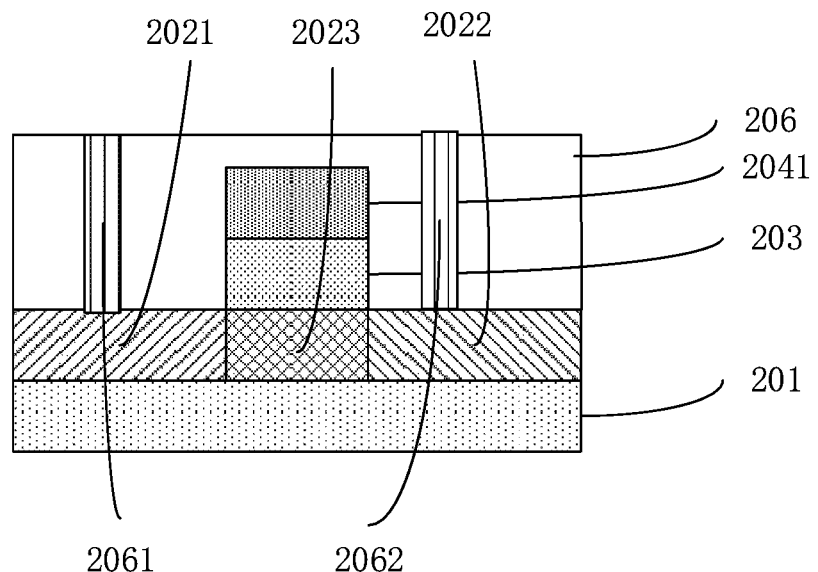
Figure 3C:
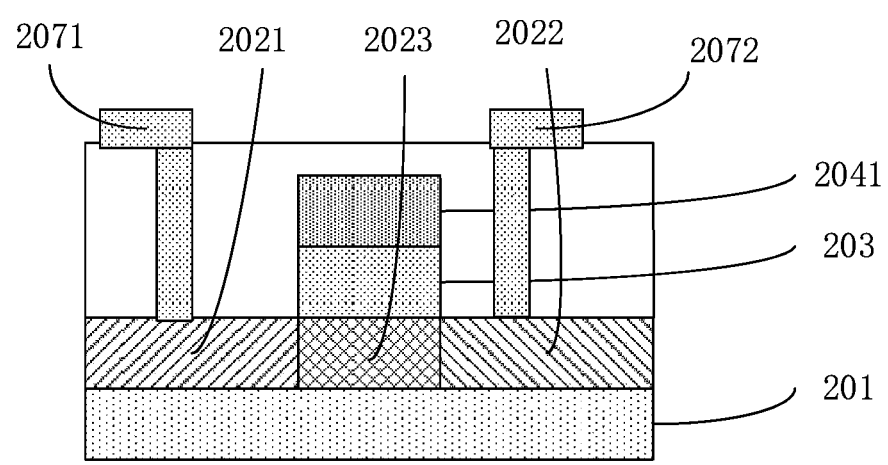

In addition, referring to FIGS. 3A to 3C, which illustrate schematic process diagrams of forming an inter-layers insulation layer, a source, and a drain in the method for manufacturing the top-gated thin film transistors provided in the preferred embodiment of the present disclosure. The method for manufacturing the top-gated thin film transistors provided from the preferred embodiment further includes a process of forming the inter-layers insulation layer, the source, and the drain, the process of forming the inter-layers insulation layer, the source, and the drain specifically includes the following.

Firstly, as shown in conjunction with FIGS. 2F and 3A, stripping the second photoresist pattern 2052.

Then, as shown in FIG. 3B, forming the inter-layers insulation layer 206 on the gate pattern 2041, the source contact region, and the drain contact region, and forming a first through hole 2061 and a second through hole 2062 passing through the inter-layers insulation layer 206, wherein the first through hole 2061 and the second through hole 2062 expose the source contact region and the drain contact region, respectively.

Finally, as shown in conjunction with FIGS. 3B and 3C, forming the source 2071 and the drain 2072 on the inter-layers insulation layer 206, wherein the source 2071 and the drain 2072 are contacted with the source contact region and the drain contact region through the first through hole 2061 and the second through hole 2062, respectively.

Preferably, stripping the second photoresist pattern may be achieved by soaking the second photoresist pattern in a peeling liquid.

The method of manufacturing the top-gated thin film transistors of the preferred embodiment comprises forming a first photoresist pattern including the first shielding portion and a second shielding portion, and adopting the first photoresist pattern as the mask for etching the gate metal layer, so that the size of the gate pattern coincides with the size of the channel region of the conductive channel, to increase the control force of the gate to the conductive channel, thereby improving the performance of the device.

The present disclosure further provides a top-gated thin film transistor which is produced by the above-described method of manufacturing the top-gated thin film transistors. The structure of the top-gated thin film transistor is characterized in that the size of the gate pattern coincides with the size of the channel region of the conductive channel. Specifically, the top-gated thin film transistor may be referred to the same manufactured by the above-described preferred embodiment of the manufacturing the top-gated thin film transistors, and it will not be described here.

The method of manufacturing top-gated thin film transistors according to the present disclosure includes forming the first photoresist pattern including the first shielding portion and the second shielding portion, and adopting the first photoresist pattern as the mask for etching the gate metal layer, so that the size of the gate pattern coincides with the size of the channel region of the conductive channel, to increase the control force of the gate to the conductive channel, thereby improving the performance of the device.

While the present disclosure has been disclosed with reference to preferred embodiments as disclosed above, the above-described embodiments are not intended to limit the present disclosure, and a person having ordinary skill in the art will be able to make various changes and modifications without departing from the spirit and scope of the present disclosure, and thus the scope of the present disclosure is defined by the scope of the claims.

What is claimed is:

1. A method for manufacturing top-gated thin film transistors, comprising:
    forming a conductive channel, a gate insulation layer, and a gate pattern on a substrate; wherein the forming the conductive channel, the gate insulation layer, and the gate pattern on the substrate specifically comprise:
        forming an active layer on the substrate, the active layer comprising a source region, a drain region, and a channel region;
        forming a gate insulation layer, a gate metal layer, and a photoresist layer on the active layer in sequence;
        performing a patterning process for the photoresist layer to form a first photoresist pattern, wherein the first photoresist pattern comprises a first shielding portion and two second shielding portions positioned at two sides of the first shielding portion; a projection of the first shielding portion on the substrate coincides with a projection of the channel region on the substrate; and a thickness of the first shielding portion is larger than a thickness of the second shielding portion;
        etching the gate metal layer by adopting the first photoresist pattern as a mask for forming a gate pattern;
        performing an ashing process for the second shielding portion of the first photoresist pattern to remove the second shielding portion of the first photoresist pattern to form a second photoresist pattern;
        etching the gate insulation layer by adopting the second photoresist pattern as another mask for exposing the source region and the drain region; and
        performing a conductorizing process for the active layer to form a source contact region on the source region and to form a drain contact region on the drain region, wherein the source contact region, the drain contact region, and the channel region commonly form a conducting channel;
    wherein a projection of the gate pattern on the substrate coincides with a projection of the channel region on the substrate, and the ashing process is performed for the second shielding portion of the first photoresist pattern by adopting oxygen.

2. The method for manufacturing the top-gated thin film transistors as claimed in claim 1, wherein the patterning process for the photoresist layer to form the first photoresist pattern comprises exposing the photoresist layer by adopting a halftone mask, and developing the exposed photoresist layer by a developing solution to form the first photoresist pattern.

3. The method for manufacturing the top-gated thin film transistors as claimed in claim 1, wherein a material of the active layer is indium gallium zinc oxide or amorphous silicon.

4. The method for manufacturing the top-gated thin film transistors as claimed in claim 1, further comprising: forming an inter-layers insulation layer, a source, and a drain, wherein the processes of forming the inter-layers insulation layer, the source, and the drain specifically comprises steps of:
   stripping the second photoresist pattern;
   forming the inter-layers insulation layer on the gate pattern, the source contact region, and the drain contact region; and forming a first through hole and a second through hole passing through the inter-layers insulation layer, wherein the first through hole and the second through hole expose the source contact region and the drain contact region, respectively; and
   forming the source and the drain on the inter-layers insulation layer, wherein the source and the drain are contacted with the source contact region and the drain contact region through the first through hole and the second through hole, respectively.

5. The method for manufacturing the top-gated thin film transistors as claimed in claim 4, wherein the step of stripping the second photoresist pattern specifically comprises: soaking the second photoresist pattern in a peeling liquid.

6. The method for manufacturing the top-gated thin film transistors as claimed in claim 1, wherein a material of the gate insulation layer comprises one or both of silicon oxide and silicon nitride.

7. The method for manufacturing the top-gated thin film transistors as claimed in claim 1, wherein the conductorizing process for the active layer is performed by adopting plasma.

8. A method for manufacturing top-gated thin film transistors, comprising:
   forming a conductive channel, a gate insulation layer, and a gate pattern on a substrate; wherein the forming the conductive channel, the gate insulation layer, and the gate pattern on the substrate specifically comprises:
      forming an active layer on the substrate, the active layer comprising a source region, a drain region, and a channel region;
      forming a gate insulation layer, a gate metal layer, and a photoresist layer on the active layer in sequence;
      performing a patterning process for the photoresist layer to form a first photoresist pattern, wherein the first photoresist pattern comprises a first shielding portion and two second shielding portions positioned at two sides of the first shielding portion; a projection of the first shielding portion on the substrate coincides with a projection of the channel region on the substrate; and a thickness of the first shielding portion is larger than a thickness of the second shielding portion;
      etching the gate metal layer by adopting the first photoresist pattern as a mask for forming a gate pattern;
      performing an ashing process for the second shielding portion of the first photoresist pattern to remove the second shielding portion of the first photoresist pattern to form a second photoresist pattern;
      etching the gate insulation layer by adopting the second photoresist pattern as another mask for exposing the source region and the drain region; and
   performing a conductorizing process for the active layer to form a source contact region on the source region and to form a drain contact region on the drain region, wherein the source contact region, the drain contact region, and the channel region commonly form a conducting channel.

9. The method for manufacturing the top-gated thin film transistors as claimed in claim 8, wherein a projection of the gate pattern on the substrate coincides with a projection of the channel region on the substrate.

10. The method for manufacturing the top-gated thin film transistors as claimed in claim 8, wherein the patterning processing for the photoresist layer to form the first photoresist pattern comprises exposing the photoresist layer by utilizing a halftone mask, and developing the exposed photoresist layer by a developing solution to form the first photoresist pattern.

11. The method for manufacturing the top-gated thin film transistors as claimed in claim 9, wherein the patterning processing for the photoresist layer to form the first photoresist pattern comprises exposing the photoresist layer by utilizing a halftone mask, and developing the exposed photoresist layer by a developing solution to form the first photoresist pattern.

12. The method for manufacturing the top-gated thin film transistors as claimed in claim 8, wherein an ash processing is performed for the second shielding portion of the first photoresist pattern by adopting oxygen.

13. The method for manufacturing the top-gated thin film transistors as claimed in claim 8, wherein a material of the active layer is indium gallium zinc oxide or amorphous silicon.

14. The method for manufacturing the top-gated thin film transistors as claimed in claim 8, further comprising: a process of forming an inter-layers insulation layer, a source, and a drain, wherein the processes of forming the inter-layers insulation layer, the source, and the drain specifically comprises steps of:
   stripping the second photoresist pattern;
   forming the inter-layers insulation layer on the gate pattern, the source contact region, and the drain contact region, and forming a first through hole and a second through hole passing through the inter-layers insulation layer, wherein the first through hole and the second through hole expose the source contact region and the drain contact region, respectively; and
   forming the source and the drain on the inter-layers insulation layer, wherein the source and the drain are contacted with the source contact region and the drain contact region through the first through hole and the second through hole, respectively.

15. The method for manufacturing the top-gated thin film transistors as claimed in claim 14, wherein the step of stripping the second photoresist pattern specifically comprises: soaking the second photoresist pattern in a peeling liquid.

16. The method for manufacturing the top-gated thin film transistors as claimed in claim 8, wherein a material of the gate insulation layer comprises one or both of silicon oxide and silicon nitride.

17. The method for manufacturing the top-gated thin film transistors as claimed in claim 8, wherein the conductorizing process for the active layer is performed by adopting plasma.

* * * * *